(12) United States Patent
Choi et al.

(10) Patent No.: US 9,437,840 B2
(45) Date of Patent: Sep. 6, 2016

(54) ORGANIC LIGHT EMITTING DISPLAY DEVICE

(71) Applicant: SAMSUNG DISPLAY CO., LTD., Yongin, Gyeonggi-Do (KR)

(72) Inventors: Chungsock Choi, Yongin (KR); Jinkoo Kang, Yongin (KR); Sanghwan Cho, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/645,702

(22) Filed: Mar. 12, 2015

(65) Prior Publication Data

US 2016/0104869 A1 Apr. 14, 2016

(30) Foreign Application Priority Data

Oct. 10, 2014 (KR) ........................ 10-2014-0136972

(51) Int. Cl.
*H01L 51/52* (2006.01)
*H01L 27/32* (2006.01)

(52) U.S. Cl.
CPC ......... *H01L 51/5281* (2013.01); *H01L 27/323* (2013.01); *H01L 27/3246* (2013.01); *H01L 51/5246* (2013.01); *H01L 51/5256* (2013.01); *H01L 51/5284* (2013.01); *H01L 2251/301* (2013.01); *H01L 2251/303* (2013.01)

(58) Field of Classification Search
CPC .................................................. H01L 51/5281
See application file for complete search history.

(56) References Cited

U.S. PATENT DOCUMENTS

| 9,087,998 | B2* | 7/2015 | Jang | H01L 51/0097 |
|---|---|---|---|---|
| 2004/0206960 | A1* | 10/2004 | Nishikawa | H01L 51/5284 257/72 |
| 2008/0278070 | A1 | 11/2008 | Kim | |
| 2014/0117330 | A1 | 5/2014 | Cho et al. | |
| 2014/0367652 | A1 | 12/2014 | Cho et al. | |
| 2014/0374704 | A1* | 12/2014 | Jang | H01L 51/0097 257/40 |
| 2015/0162390 | A1* | 6/2015 | Wang | H01L 27/326 257/40 |
| 2015/0311477 | A1* | 10/2015 | Cho | H01L 51/5284 257/40 |

FOREIGN PATENT DOCUMENTS

| KR | 10-2008-0099684 A | 11/2008 |
|---|---|---|
| KR | 10-2010-0131074 A | 12/2010 |
| KR | 10-2010-0047054 A | 5/2012 |
| KR | 10-2012-0042549 A | 5/2012 |
| KR | 10-2010-0092907 A | 8/2012 |
| KR | 10-2014-0056498 A | 5/2014 |
| KR | 10-2014-0147199 A | 12/2014 |

* cited by examiner

*Primary Examiner* — Lex Malsawma
(74) *Attorney, Agent, or Firm* — Lee & Morse, P.C.

(57) ABSTRACT

An organic light emitting display device includes a substrate, a display unit on the substrate, the display unit including a plurality of light-emitting areas in a lattice pattern, and an antireflective film on the display unit, the antireflective film including at least two metal layers and at least two dielectric layers that are alternately stacked, and each of the at least two metal layers including a plurality of islands in a lattice pattern overlapping the light-emitting areas of the display unit.

20 Claims, 4 Drawing Sheets

ORGANIC LIGHT EMITTING DISPLAY DEVICE

CROSS-REFERENCE TO RELATED APPLICATION

Korean Patent Application No. 10-2014-0136972, filed on Oct. 10, 2014, in the Korean Intellectual Property Office, and entitled: "Organic Light Emitting Display Device," is incorporated by reference herein in its entirety.

BACKGROUND

1. Field

One or more exemplary embodiments relate to an organic light emitting display device.

2. Description of the Related Art

Organic light emitting display devices are self-luminous display devices including organic light emitting devices, in which an organic light emitting layer is disposed between a hole injection electrode and an electron injection electrode. Holes injected through the hole injection electrode and electrons injected through the electron injection electrode are combined in the organic light emitting layer to form excitons, and the excitons generate light while falling from an excited state to a ground state.

Since organic light emitting display devices are self-luminous display devices not requiring additional light sources, organic light emitting display devices may be operated at low voltage, and may have high-quality features, e.g., lightness, slimness, wide viewing angles, high contrast, and quick responsiveness. Therefore, organic light emitting display devices are considered to be the next generation of display devices.

SUMMARY

One or more exemplary embodiments include an organic light emitting display device capable of reducing reflection of external light and maintaining a high degree of touch sensitivity.

According to one or more exemplary embodiments, an organic light emitting display device including: a substrate; a display unit disposed on the substrate and including a plurality of light-emitting areas forming a lattice pattern; and an antireflective film disposed on the display unit, wherein the antireflective film includes at least two metal layers and at least two dielectric layers that are alternately stacked, and each of the at least two metal layers includes a plurality of islands overlapping the light-emitting areas and forming the lattice pattern.

The plurality of islands may be disposed inside the at least two dielectric layers.

The organic light emitting display device may further include a capacitive touch screen layer above the display unit.

The touch screen layer may be disposed on an upper side or lower side of the antireflective film.

The display unit may include a pixel defining film that defines the plurality of light-emitting areas, and a light-absorption layer including a black matrix overlapping the pixel defining film may be disposed above the display unit.

Edge portions of the black matrix may be overlapped with edge portions of the plurality of islands.

The black matrix may be formed of black metal powder and a resin in which the black metal powder may be dispersed.

The light-absorption layer may be disposed on the upper side or lower side of the antireflective film.

Each of the at least two metal layers may include at least one selected from the group consisting of aluminum (Al), molybdenum (Mo), chromium (Cr), tungsten (W), titanium (Ti), silver (Ag), nickel (Ni), cobalt (Co), copper (Cu), CrNx, TiNx, NiS, MoOx, CrOx, and WOx.

Each of the at least dielectric layers may include at least one selected from the group consisting of $SiO_2$, $CaF_2$, $MgF_2$, LiF, SiNx, SiCN, SiON, TaxOy, and TiOx.

The organic light emitting display device may further include a thin film encapsulation layer sealing the display unit.

The thin film encapsulation layer may include a plurality of inorganic films and a plurality of organic films that may be alternately stacked.

A first electrode, a second electrode, and an intermediate layer including an organic light emitting layer and disposed between the first and second electrodes may be formed in each of the light-emitting areas, and a functional layer and a protective layer may be formed between the second electrode and the thin film encapsulation layer.

The organic light emitting display device may further include an encapsulation substrate above the display unit, wherein the antireflective film may be formed on the encapsulation substrate, and a sealing material may be applied to edge portions of the substrate and the encapsulation substrate.

The organic light emitting display device may further include a capacitive touch screen layer above the display unit.

The touch screen layer may be disposed on an upper side or lower side of the antireflective film.

The display unit may include a pixel defining film that defines the plurality of light-emitting areas, and the light-absorption layer including a black matrix overlapping the pixel defining film may be disposed above the display unit.

The light-absorption layer may be disposed on an upper side or lower side of the antireflective film.

Edge portions of the black matrix may be overlapped with edge portions of the plurality of islands.

A gap may be formed between the encapsulation substrate and the display unit, and a filler may be filled in the gap.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
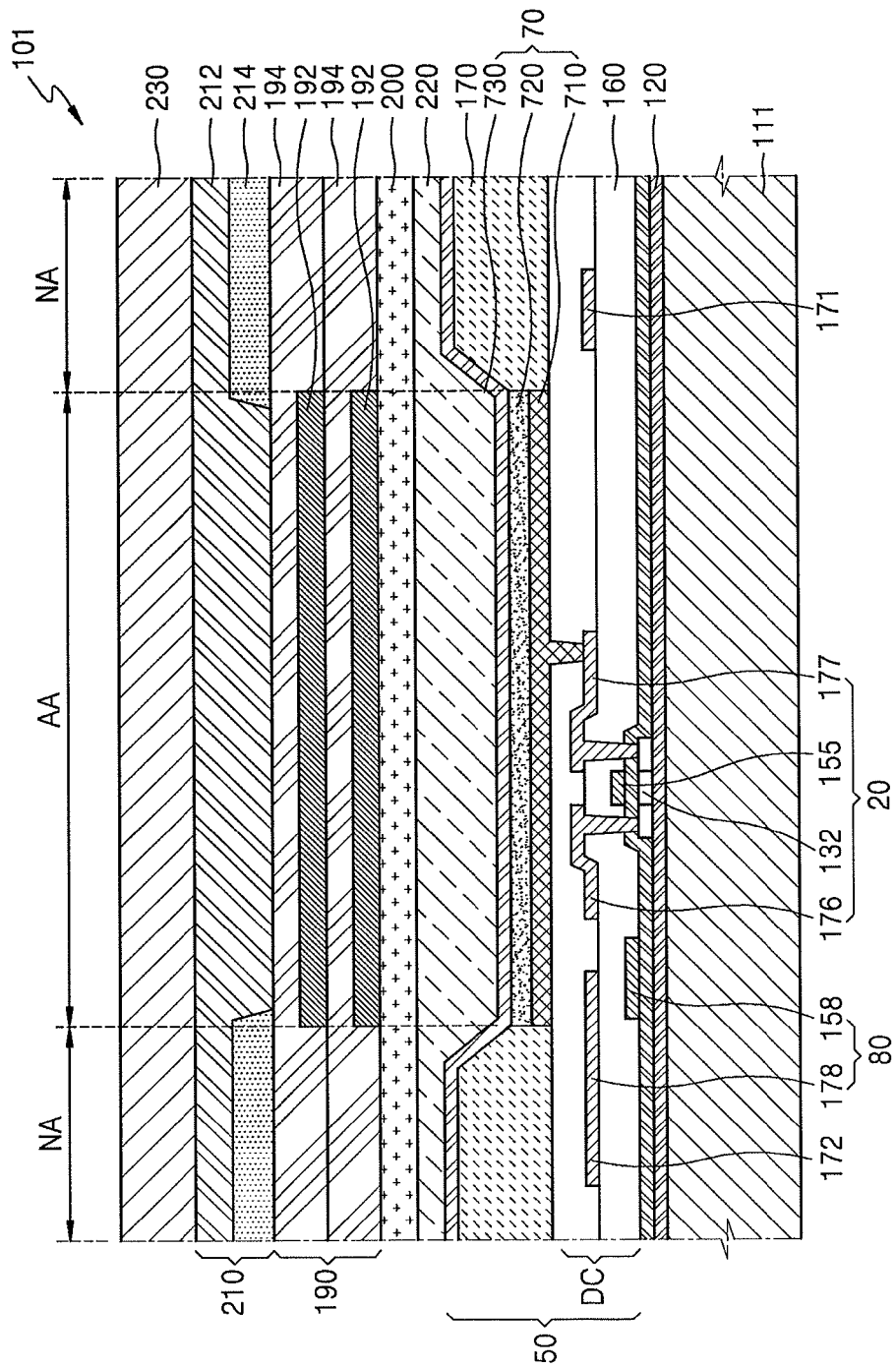
FIG. 1 illustrates a schematic cross-sectional view of an organic light emitting display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second," etc. may be used herein to describe various components, these components should not be limited by these terms. These terms are only used to distinguish one component from another. Further, as used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

When a certain embodiment may be implemented differently, a specific process order may be performed differently from the described order. For example, two consecutively described processes may be performed substantially at the same time or performed in an order opposite to the described order.

Hereinafter, the exemplary embodiments will be described in detail with reference to the accompanying drawings.

Figure 2:
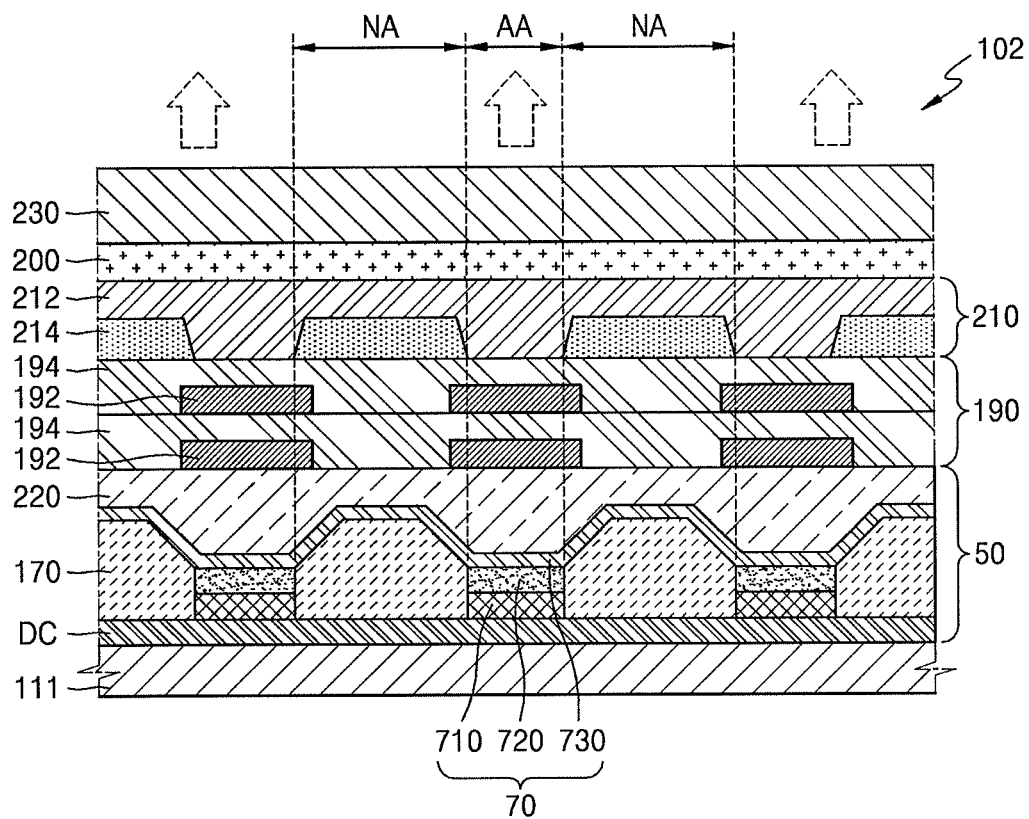
FIGS. 2 and 3 illustrate schematic cross-sectional views of modification examples of the organic light emitting display device in FIG. 1.
Figure 3:
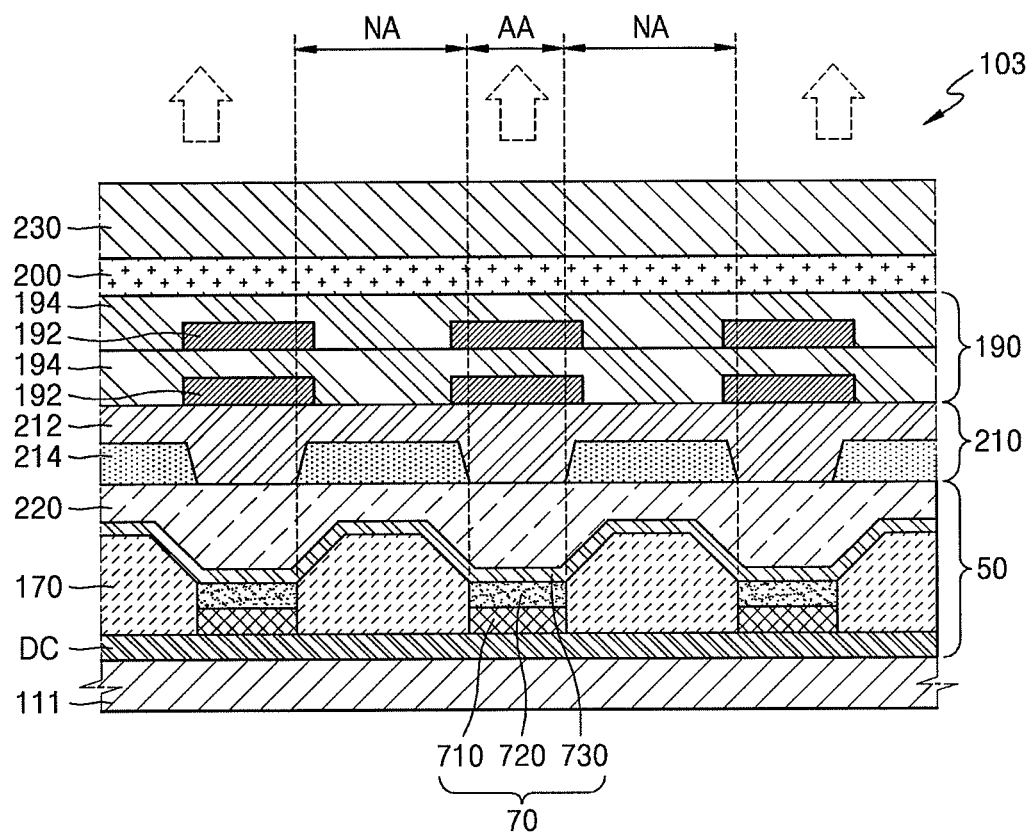

FIG. 1 is a schematic cross-sectional view illustrating an organic light emitting display device 101 according to an exemplary embodiment. FIGS. 2 and 3 are schematic cross-sectional views illustrating modifications of the organic light emitting display device 101 illustrated in FIG. 1.

First, referring to FIG. 1, the organic light emitting display device 101 of the exemplary embodiment may include a substrate 111, a display unit 50, an antireflective film 190, a touch screen layer 200, a light-absorption layer 210, and a cover window 230. In addition, the organic light emitting display device 101 may further include a thin film encapsulation layer 220 as an encapsulation member.

For example, the substrate 111 may be an insulating substrate, e.g., formed of glass, quartz, or a ceramic material, or may be a flexible substrate, e.g., formed of a plastic material. In another example, the substrate 111 may be a metallic substrate formed of metal, e.g., stainless steel. A buffer layer 120 may be formed on the substrate 111. The buffer layer 120 may form a flat surface on an upper side of the substrate 111, and may block permeation of foreign substance or moisture through the substrate 111.

The display unit 50 is formed on the substrate 111. The display unit 50 may include organic light emitting devices 70 and a driving circuit unit DC applying electric signals to the organic light emitting devices 70. Each of the organic light emitting devices 70 may include a first electrode 710, an intermediate layer 720, and a second electrode 730.

For example, the first electrode 710 may be an anode functioning as a hole injection electrode, and the second electrode 730 may be a cathode functioning as an electron injection electrode. However, the current exemplary embodiment is not limited thereto, e.g., the first electrode 710 may be a cathode, and the second electrode 730 may be an anode. The intermediate layer 720 may include an organic light emitting layer capable of emitting red, green, blue, or white light. In addition, the intermediate layer 720 may further include various functional layers, e.g., a hole injection layer (HIL), a hole transport layer, an electron transport layer, and an electron injection layer.

The display unit 50 may further include a pixel defining film 170 having an opening through which at least a portion of the first electrode 710 is exposed, and the intermediate layer 720 may be formed on the exposed portion of the first electrode 710 through the opening of the pixel defining film 170. In this manner, the pixel defining film 170 may define a plurality of light-emitting areas AA. For example, the light-emitting areas AA may be formed in the form of a lattice pattern. Areas in which the pixel defining film 170 is formed, i.e., areas other than the light-emitting areas AA, may be non-light-emitting areas NA.

The driving circuit unit DC may include thin film transistors 20 and capacitors 80. In addition, the driving circuit unit DC may further include common power lines 172 and data lines 171 for supplying power. In FIG. 1, only the thin film transistors 20 used to drive the organic light emitting devices 70 are illustrated. However, the organic light emitting display device 101 may further include switching thin film transistors for delivering data voltages from the data lines 171 to the capacitors 80.

The thin film transistors 20 are used to drive the organic light emitting devices 70. Each of the thin film transistors 20 may include an active layer 132, a gate electrode 155, a source electrode 176, and a drain electrode 177.

The active layer 132 may include various materials. For example, the active layer 132 may include an inorganic semiconductor material, e.g., amorphous silicon or crystalline silicon. In another example, the active layer 132 may include an oxide semiconductor material or an organic semiconductor material.

The gate electrode 155 may be connected to a gate line (not shown) through which an on/off signal is applied to the thin film transistors 20. The gate electrode 155 may be formed of a low resistive metallic material. For example, a film formed of a conductive material, e.g., molybdenum (Mo), aluminum (Al), copper (Cu), or titanium (Ti) may be formed into a multilayer or single-layer structure as the gate electrode 155.

The source electrode 176 and the drain electrode 177 may be formed as a single layer or multiple layers by using a highly conductive material. The source electrode 176, the drain electrode 177, and the active layer 132 are in contact with a region doped with an impurity.

Each of the capacitors 80 includes a first capacitor plate 158 and a second capacitor plate 178 that are arranged with an interlayer insulating layer 160 being disposed therebetween. The interlayer insulating layer 160 may be formed of a dielectric, and the common power line 172 may function as the second capacitor plate 178. In this case, the capacitors 80 may store voltage corresponding to a difference between a common voltage applied to the thin film transistors 20 through the common power line 172 and a data voltage applied from the switching thin film transistors (not shown), and a current corresponding to the voltage stored in the capacitors 80 may be applied to the organic light emitting devices 70 through the thin film transistors 20.

The thin film encapsulation layer 220 may be formed on the display unit 50. The thin film encapsulation layer 220 may encapsulate the display unit 50 to prevent the permeation of moisture or oxygen into the display unit 50. The thin film encapsulation layer 220 may include a plurality of inorganic films and a plurality of organic films that are alternately stacked.

Each of the inorganic films may be a single film or a laminate film formed of a metal oxide or a metal nitride. For example, the inorganic films may include one of $SiN_x$, $Al_2O_3$, $SiO_2$, and $TiO_2$.

The organic films have functions of reducing internal stress of the inorganic films, compensating for defects of the inorganic films, and planarizing the inorganic films. Each of the organic films may be formed of a polymer. For example, each of the organic films may be a single film or a laminate film formed of one of polyethylene terephthalate, polyimide, polycarbonate, epoxy, polyethylene, and polyacrylate.

In addition, a functional layer and a protective layer may be formed between the second electrode 730 and the thin film encapsulation layer 220. For example, the functional layer may include a capping layer and a blocking layer.

The capping layer may be formed of an organic material, e.g., a-NPD, NPB, TPD, m-MTDATA, $Alq_3$ or CuPc, and may have a function of facilitating emission of light from the organic light emitting devices 70 in addition to a function of protecting the organic light emitting devices 70. The blocking layer may be formed of an inorganic material, e.g., LiF, $MgF_2$, or $CaF_2$, for protecting the capping layer and the organic light emitting devices 70.

The protective layer may be formed on the functional layer by using an inorganic material, e.g., an oxide or a nitride. For example, the protective layer may include aluminum oxide.

The antireflective film 190 may be disposed above the display unit 50 to reduce the reflection of external light and, thus, to improve the contrast of the organic light emitting display device 101. The antireflective film 190 may be a black thin film (BTF) having a stacked structure formed by metal layers 192 and dielectric layers 194.

For example, the antireflective film 190 may include at least two metal layers 192 and at least two dielectric layers 194 that are alternately stacked. The at least two metal layers 192 may absorb and reflect light incident from the outside, and the at least two dielectric layers 194 may adjust or correct the phases of light reflected from the at least two metal layers 192, so that the light rays may destructively interfere with each other and cancel each other out.

In detail, a first dielectric layer 194 disposed between two metal layers 192 may adjust the distance between the two metal layers 192, so that light reflected from the two metal layers 192 may have a phase difference of about 180°. In addition, if the phase difference between light reflected from the two metal layers 192 is not 180° due to the wavelength of external light, a second dielectric layer 194 formed in the upper most layer of the antireflective film 190, i.e., a second dielectric layer 194 above the second metal layer 192, may adjust the phases of light reflected from the two metal layers 192 to cause destructive interference between the light reflected from the two metal layers 192.

Each of the dielectric layers 194 may include at least one of, e.g., $SiO_2$, $CaF_2$, $MgF_2$, LiF, SiNx, SiCN, SiON, TaxOy, and TiOx, and may have a thickness equal to about ¼ of the wavelength of incident light. However, the dielectric layers 194 are not limited thereto.

Each of the metal layers 192 may be formed of a material including at least one of, e.g., aluminum (Al), molybdenum (Mo), chromium (Cr), tungsten (W), titanium (Ti), silver (Ag), nickel (Ni), cobalt (Co), copper (Cu), $CrN_x$, $TiN_x$, NiS, $MoO_x$, $CrO_x$, and $WO_x$, and may have a thickness of about 6 nm to about 15 nm. If the thickness of each of the metal layers 192 is less than about 6 nm, the amount of external light absorbed by the metal layers 192 may be small, and thus a relatively large amount of the external light may be reflected. In this case, the organic light emitting display device 101 may be less visible or recognizable. If the thickness of each of the metal layers 192 is greater than about 15 nm, the transmittance of light emitted from the display unit 50 and passing through the metal layers 192 may be decreased, and thus the optical efficiency of the organic light emitting display device 101 may be lowered.

Each of the metal layers 192 may be patterned such that each of the metal layers 192 may overlap the light-emitting areas AA. That is, each of the metal layers 192 may be made up of a plurality of islands forming the same lattice pattern as the lattice pattern formed by the light-emitting areas AA, and the islands of the metal layers 192 may be located in the dielectric layers 194. Therefore, the islands may be electrically insulated from each other.

In detail, each of the metal layers 192 may include a plurality of discrete island patterns spaced apart from each other along two directions orthogonal to each other, i.e., in a lattice pattern. The lattice pattern of each metal layer 192 may correspond to, e.g., completely overlap, the lattice pattern of the light-emitting areas AA in the display unit 50. For example, as illustrated in FIG. 1, as the dielectric layers 194 may continuously overlap the light-emitting areas AA and the non-light-emitting areas NA of the display unit 50, patterns of the patterned metal layers 192 may be surrounded by the dielectric layers 194, e.g., patterns of the patterned metal layers 192 may be embedded within vertically stacked dielectric layers 194. In other words, portions of the dielectric layers 194 in the non-light-emitting areas NA may be thicker than portion of the dielectric layers 194 in the light-emitting areas AA, and may be stacked on top of each other, while portion of the dielectric layers 194 in the light-emitting areas AA may accommodate therebetween patterns of the metal layers 192.

For example, the antireflective film 190 may be formed by repeatedly stacking the metal layers 192 and the dielectric layers 194. In this case, the dielectric layers 194 may cover the metal layers 192 that are patterned, and may provide flat upper surfaces for the metal layers 192.

Since the metal layers 192 are formed only in the light-emitting areas AA, light incident on regions in which the pixel defining film 170 is formed, i.e., light incident on the non-light-emitting areas NA, may be absorbed by the light-absorption layer 210. The light-absorption layer 210 may be disposed above the display unit 50, and may include a resin layer 212 and a black matrix 214.

The resin layer 212 may be formed of a light-transmitting material, and may provide a flat upper surface. The resin layer 212 may fix the position of the black matrix 214. For example, the resin layer 212 may be an optical adhesive layer. However, the resin layer 212 is not limited thereto.

The black matrix 214 overlaps the pixel defining film 170, and may absorb light incident on the non-light-emitting areas NA. Therefore, the reflection of external light decreasing the visibility of the organic light emitting display device 101 may be reduced.

The black matrix 214 may be formed of black metal powder and a resin, in which the black metal powder is dispersed, and thus the black matrix 214 may have insulating characteristics. For example, the black metal powder may be copper, iron, or cobalt powder having a black color due to oxidation, and the resin may be an acrylic resin. However, the black matrix 214 is not limited thereto. In addition, the black matrix 214 may include a photopolymerizable monomer and a photopolymerization initiator.

In FIG. 1, the light-absorption layer 210 is formed on an upper side of the antireflective film 190. However, the exemplary embodiments of the present disclosure are not limited thereto. For example, as shown in FIG. 3, in an organic light emitting display device 103, the light-absorption layer 210 may be formed on a lower side of the antireflective film 190.

That is, as described above, the antireflective film 190 reduces the reflection of external light in the light-emitting areas AA, and the black matrix 214 absorbs external light in the non-light-emitting areas NA. Therefore, the same effects may be obtained regardless of whether the light-absorption layer 210 is disposed on the upper side or lower side of the antireflective film 190.

However, since the metal layers 192 and the black matrix 214 are not formed in the same layer, if edges of the metal layers 192 are aligned with edges of the black matrix 214 when viewed in a vertical direction, reflection of external light incident at an oblique angle may be perceived, and a ghost phenomenon may occur due to light emitted from the display unit 50 at an oblique angle. Therefore, edge portions of the black matrix 214 and edge portions of the islands of the metal layers 192 may be partially overlapped with each other, so as to block light coming in or going out at an oblique angle.

The touch screen layer 200 may include a touch sensor in which first touch electrodes and second touch electrodes cross each other. For example, the touch sensor may be a capacitive touch sensor configured to sense touch if the capacitance of the first and second electrodes crossing each other is varied at a position.

As shown in FIG. 1, the touch screen layer 200 may be disposed on a lower side of the antireflective film 190. However, in another exemplary embodiment, the thin film encapsulation layer 220 may be disposed on an upper side of the antireflective film 190, as in an organic light emitting display device 102 illustrated in FIG. 2. The antireflective film 190 includes the metal layers 192 therein. However, since the metal layers 192 are made up of a plurality of islands formed by patterning, the sensing operation of the touch screen layer 200 is not affected by the metal layers 192. Therefore, the touch screen layer 200 may maintain a high degree of touch sensitivity regardless of whether the touch screen layer 200 is disposed on the upper or lower side of the antireflective film 190.

For example, although the touch screen layer 200 is disposed on the lower side of the antireflective film 190 as shown in FIG. 1, an electric charge formed between an object touching the organic light emitting display device 101 and a first or second touch electrode is not conducted to neighboring touch electrodes through the metal layers 192. Therefore, the touch screen layer 200 may maintain a high degree of touch sensitivity. This is the same in the case in which the touch screen layer 200 is disposed on the upper side of the antireflective film 190 as shown in FIG. 2. That is, the sensing operation of the touch screen layer 200 is not affected by the metal layers 192 of the antireflective film 190.

That is, since the antireflective film 190 of the organic light emitting display device 101 of the exemplary embodiment is a black thin film (BTF) having a stacked structure formed by the metal layers 192 and the dielectric layers 194, a circularly polarizing plate of the related art may not be used. Particularly, since the metal layers 192 include a plurality of islands formed by patterning, the antireflective film 190 may not cause electromagnetic shielding or interference during the sensing operation of the touch screen layer 200. Therefore, the touch screen layer 200 may maintain a high degree of touch sensitivity.

In addition, as described above, since the black matrix 214 is insulating, the black matrix 214 may not electrically interfere with the first touch electrodes and the second touch electrodes. Therefore, the touch screen layer 200 may be disposed below the light-absorption layer 210 as shown in FIG. 1, or above the light-absorption layer 210 as shown in FIGS. 2 and 3. That is, the relative positions of the antireflective film 190, the touch screen layer 200, and the light-absorption layer 210 are not limited to the exemplary embodiments shown in FIGS. 1 to 3. That is, the antireflective film 190, the touch screen layer 200, and the light-absorption layer 210 may be stacked in various orders.

The cover window 230 may protect the display unit 50 from, e.g., external, impact. The cover window 230 may be formed of a material including at least one of, e.g., polyethylene terephthalate (PET), polystyrene (PS), polyethylene naphthalate (PEN), polyether sulfone (PES), and polyethylene (PE). However, the cover window 230 is not limited thereto.

Figure 4:
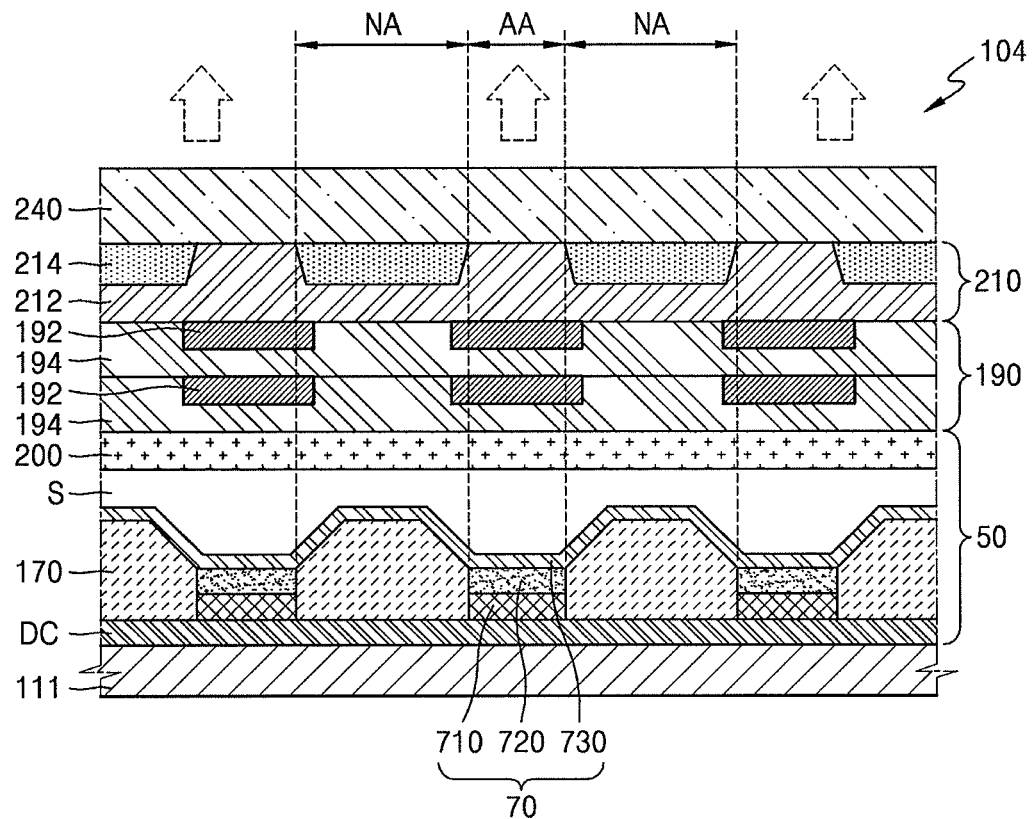
FIG. 4 illustrates a schematic cross-sectional view of an organic light emitting display device according to another exemplary embodiment.

FIG. 4 is a schematic cross-sectional view illustrating an organic light emitting display device 104 according to another exemplary embodiment.

Referring to FIG. 4, the organic light emitting display device 104 may include the substrate 111 on which the display unit 50 is formed, and an encapsulation substrate 240 having a side on which the light-absorption layer 210, the antireflective film 190, and the touch screen layer 200 are sequentially formed.

The substrate 111 and the encapsulation substrate 240 may be glass substrates, plastic substrates, e.g., acrylic substrates, and/or metal substrates.

The display unit 50 includes the organic light emitting devices 70 and the driving circuit unit DC that apply electric signals to the organic light emitting devices 70. Each of the organic light emitting devices 70 may include the first electrode 710, the intermediate layer 720, and the second electrode 730. The intermediate layer 720 includes the organic light emitting layer, and is formed in the opening of the pixel defining film 170. In this manner, the pixel defining film 170 may define the plurality of light-emitting areas AA. For example, the light-emitting areas AA may be formed in the form of a lattice pattern. Areas in which the pixel defining film 170 is formed, i.e., areas other than the light-emitting areas AA, may be the non-light emitting areas NA.

The light-absorption layer 210 may include the black matrix 214 corresponding to the non-light-emitting areas NA, and the resin layer 212. The resin layer 212 may be a dielectric layer for adjusting the phases of light reflected from the antireflective film 190.

The antireflective film 190 may include the plurality of metal layers 192 corresponding to the light-emitting areas AA, and the plurality of dielectric layers 194 alternating with the metal layers 192. Therefore, although a circularly polarizing plate is not used, the reflection of external light may be reduced. In addition, since the metal layers 192 include a plurality of islands formed by patterning, the antireflective film 190 may not cause electromagnetic shielding or interference during the sensing operation of the touch screen layer 200. Therefore, the touch screen layer 200 may maintain a high degree of touch sensitivity.

For example, after the light-absorption layer 210, the antireflective film 190, and the touch screen layer 200 are sequentially formed on the encapsulation substrate 240, the encapsulation substrate 240 and the substrate 111 may be attached together using a sealing material, e.g., glass frit. However, the stacked order of the antireflective film 190, the touch screen layer 200, and the light-absorption layer 210 is not limited to that shown in FIG. 4. That is, the relative positions of the antireflective film 190, the touch screen layer 200, and the light-absorption layer 210 may be variously changed.

The sealing material may be applied to edge portions of the encapsulation substrate 240 and the substrate 111, and then may be photocured or thermally cured for attaching the encapsulation substrate 240 and the substrate 111 together.

A gap S may be formed between the encapsulation substrate 240 and the display unit 50. The gap S may be maintained in a vacuum state or filled with a filler for the mechanical stability of the organic light emitting display device 104. The mechanical stability of the organic light emitting display device 104 may be maintained owing to the filler even in impact conditions.

As described above, in the organic light emitting display device according to the one or more of the above exemplary embodiments, the antireflective film has a stacked structure of metal layers and dielectric layers. Therefore, although a circularly polarizing plate is not used, the reflection of external light may be reduced. In addition, since the metal layers are made up of a plurality of islands, electric interference may not occur during the sensing operation of the touch screen layer, and thus the organic light emitting display device may maintain a high degree of touch sensitivity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a substrate;
   a display unit on the substrate, the display unit including a plurality of light-emitting areas in a lattice pattern; and
   an antireflective film on the display unit, the antireflective film including at least two metal layers and at least two dielectric layers that are alternately stacked, and each of the at least two metal layers including a plurality of islands in a lattice pattern overlapping the light-emitting areas of the display unit.

2. The organic light emitting display device as claimed in claim 1, wherein the plurality of islands are disposed inside the at least two dielectric layers.

3. The organic light emitting display device as claimed in claim 1, further comprising a capacitive touch screen layer above the display unit.

4. The organic light emitting display device as claimed in claim 3, wherein the capacitive touch screen layer is on an upper side or lower side of the antireflective film.

5. The organic light emitting display device as claimed in claim 1, wherein the display unit further comprises a pixel defining film defining the plurality of light-emitting areas, a light-absorption layer having a black matrix overlapping the pixel defining film being disposed above the display unit.

6. The organic light emitting display device as claimed in claim 5, wherein edge portions of the black matrix overlap edge portions of the plurality of islands.

7. The organic light emitting display device as claimed in claim 5, wherein the black matrix includes black metal powder dispersed in resin.

8. The organic light emitting display device as claimed in claim 5, wherein the light-absorption layer is on an upper side or a lower side of the antireflective film.

9. The organic light emitting display device as claimed in claim 1, wherein each of the at least two metal layers includes at least one of aluminum (Al), molybdenum (Mo), chromium (Cr), tungsten (W), titanium (Ti), silver (Ag), nickel (Ni), cobalt (Co), copper (Cu), $CrN_x$, $TiN_x$, NiS, $MoO_x$, $CrO_x$, and $WO_x$.

10. The organic light emitting display device as claimed in claim 1, wherein each of the at least two dielectric layers includes at least one of $SiO_2$, $CaF_2$, $MgF_2$, LiF, $SiN_x$, SiCN, SiON, $Ta_xO_y$, and $TiO_x$.

11. The organic light emitting display device as claimed in claim 1, further comprising a thin film encapsulation layer sealing the display unit.

12. The organic light emitting display device as claimed in claim 11, wherein the thin film encapsulation layer includes a plurality of alternately stacked inorganic films and organic films.

13. The organic light emitting display device as claimed in claim 11, wherein:
   each of the light-emitting areas includes a first electrode, a second electrode, and an intermediate layer with an organic light emitting layer between the first and second electrodes, and
   a functional layer and a protective layer are positioned between the second electrode and the thin film encapsulation layer.

14. The organic light emitting display device as claimed in claim 1, further comprising an encapsulation substrate above the display unit, the antireflective film being on the encapsulation substrate, and a sealing material being on edge portions of the substrate and the encapsulation substrate.

15. The organic light emitting display device as claimed in claim 14, further comprising a capacitive touch screen layer above the display unit.

16. The organic light emitting display device as claimed in claim 15, wherein the display unit further comprises a pixel defining film defining the plurality of light-emitting areas, a light-absorption layer having a black matrix overlapping the pixel defining film being disposed above the display unit.

17. The organic light emitting display device as claimed in claim 16, wherein the light-absorption layer is on an upper side or a lower side of the antireflective film.

18. The organic light emitting display device as claimed in claim 16, wherein edge portions of the black matrix overlap edge portions of the plurality of islands.

19. The organic light emitting display device as claimed in claim 14, wherein the capacitive touch screen layer is on an upper side or a lower side of the antireflective film.

20. The organic light emitting display device as claimed in claim 14, further comprising a gap between the encapsulation substrate and the display unit, a filler being in the gap.

* * * * *